(12) United States Patent
Shifren

(10) Patent No.: US 10,147,879 B2
(45) Date of Patent: Dec. 4, 2018

(54) MULTIPLE IMPEDANCE CORRELATED ELECTRON SWITCH FABRIC

(71) Applicant: ARM Ltd., Cambridge (GB)

(72) Inventor: Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 14/871,692

(22) Filed: Sep. 30, 2015

(65) Prior Publication Data

US 2017/0092858 A1  Mar. 30, 2017

(51) Int. Cl.
*H01L 49/00* (2006.01)
*H01L 27/24* (2006.01)
*H01L 45/00* (2006.01)

(52) U.S. Cl.
CPC ........ *H01L 49/003* (2013.01); *H01L 27/2409* (2013.01); *H01L 27/2436* (2013.01); *H01L 27/2481* (2013.01); *H01L 45/04* (2013.01); *H01L 45/1233* (2013.01); *H01L 45/14* (2013.01); *H01L 45/146* (2013.01); *H01L 45/147* (2013.01); *H01L 45/1683* (2013.01)

(58) Field of Classification Search
CPC ....... H01L 45/04; H01L 45/14; H01L 45/146; H01L 45/147; H01L 45/1608; H01L 45/1683; H01L 45/1641; H01L 49/003; H01L 27/2409; H01L 27/2436; H01L 27/2481
USPC .............................................. 257/2, E45.003
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,697,316 | B2 * | 4/2010 | Lai ...................... G11C 11/5664 365/100 |
| 7,778,063 | B2 | 8/2010 | Brubaker et al. |
| 7,872,900 | B2 | 1/2011 | Paz de Araujo et al. |
| 8,729,518 | B2 * | 5/2014 | Pickett .................... H01L 47/00 257/2 |
| 8,816,719 | B2 | 8/2014 | McWilliams et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 2005/0236691 | A1 | 10/2005 | Shimada |
| 2007/0114508 | A1 * | 5/2007 | Herner .................. H01L 45/145 257/2 |
| 2008/0011996 | A1 | 1/2008 | Bednorz et al. |

(Continued)

FOREIGN PATENT DOCUMENTS

WO  2008/058264 A2  5/2008
WO  2008/058264 A3  5/2008

OTHER PUBLICATIONS

Imada et al, "Metal-Insulator Transitions", Reviews of Modern Physics 70(4), pp. 1039-1247 (1998), published by the American Physical Society.*

(Continued)

*Primary Examiner* — Johannes P Mondt
(74) *Attorney, Agent, or Firm* — Berkeley Law & Technology Group, LLP

(57) ABSTRACT

Subject matter disclosed herein may relate to correlated electron switch devices, and may relate more particularly to integrated circuit fabrics including correlated electron switch devices having various impedance characteristics.

20 Claims, 15 Drawing Sheets

(56) References Cited

U.S. PATENT DOCUMENTS

| | | |
|---|---|---|
| 2008/0106926 A1 | 5/2008 | Brubaker |
| 2008/0107801 A1 | 5/2008 | Celinska et al. |
| 2013/0200323 A1 | 8/2013 | Pham et al. |
| 2013/0214232 A1 | 8/2013 | Tendulkar et al. |
| 2013/0285699 A1 | 10/2013 | McWilliams et al. |
| 2015/0091067 A1* | 4/2015 | Pillarisetty ........ H01L 29/66477 257/288 |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

GB2016/053033 /: Initial Publication with ISR, Apr. 6, 2017, 56 pages.
GB2016/053033 /: Written Opinion of the International Search Authority, dated Apr. 6, 2017, 5 pages.
TW App. No. 105131576 // Publication TW201721856, published Jun. 16, 2017, 68 pages.
McWilliams, C.R. et al., "Device characterization of correlated electron random access memories", Journal of Applied Physics, vol. 109, No. 9, 091608, May 13, 2011, sections II, II.A; figures 1, 3, 4.
PCT/GB2016/053033: International Search Report and Written Opinion, dated Dec. 13, 2016, 13 pages.
International Preliminary Report on Patentability, International Application No. PCT/GB2016/053033,, dated Apr. 12, 2018, 2 pgs.
Written Opinion of the International Searching Authority, International Application No. PCT/GB2016/053033,, dated Apr. 12, 2018, 5 pgs.

* cited by examiner

MULTIPLE IMPEDANCE CORRELATED ELECTRON SWITCH FABRIC

BACKGROUND

Field

Subject matter disclosed herein may relate to correlated electron switch devices, and may relate more particularly to integrated circuit fabrics including correlated electron switch devices having various impedance characteristics.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an example symbol for a correlated electron switch.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory and/or logic devices. CES devices may also be utilized in a wide range of other electronic circuit types, such as, for example, filter circuits, data converters, phase locked loop circuits, and high-speed transceivers, although the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_c)^{1/3} a \sim 0.26$, where $n_c$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

Figure 1A:
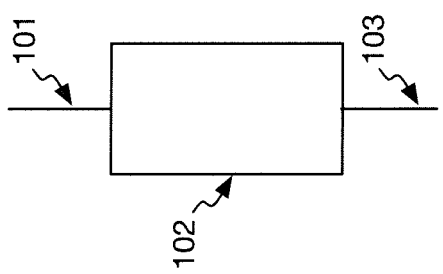
FIG. 1a shows block diagram of an example embodiment of a correlated electron switch device comprising a correlated electron material, in accordance with an embodiment.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
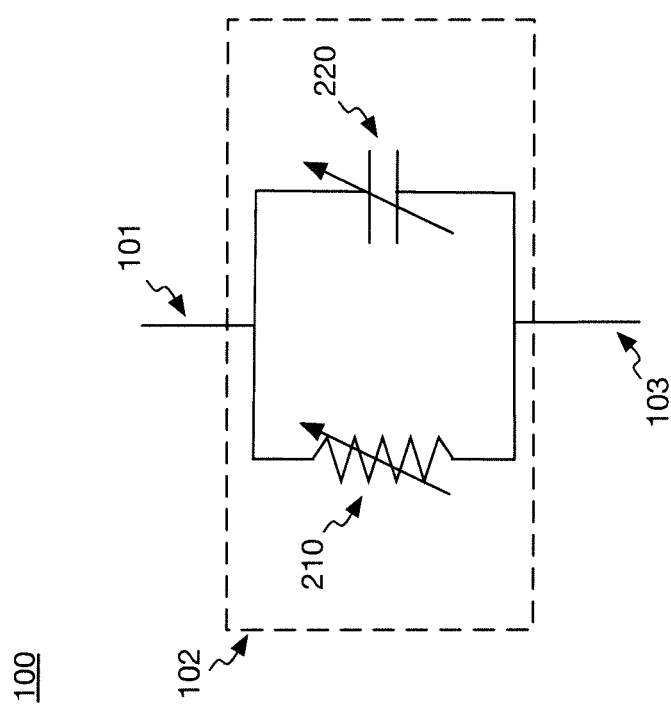
FIG. 2 is a schematic diagram of an equivalent circuit of a correlated electron switch, in accordance with an embodiment.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics for a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, example truth table 120 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10-100,000 times lower than a resistance of a higher resistance state, although claimed subject matter is not limited in scope in this respect. Similarly, example truth table 120 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

Figure 3:
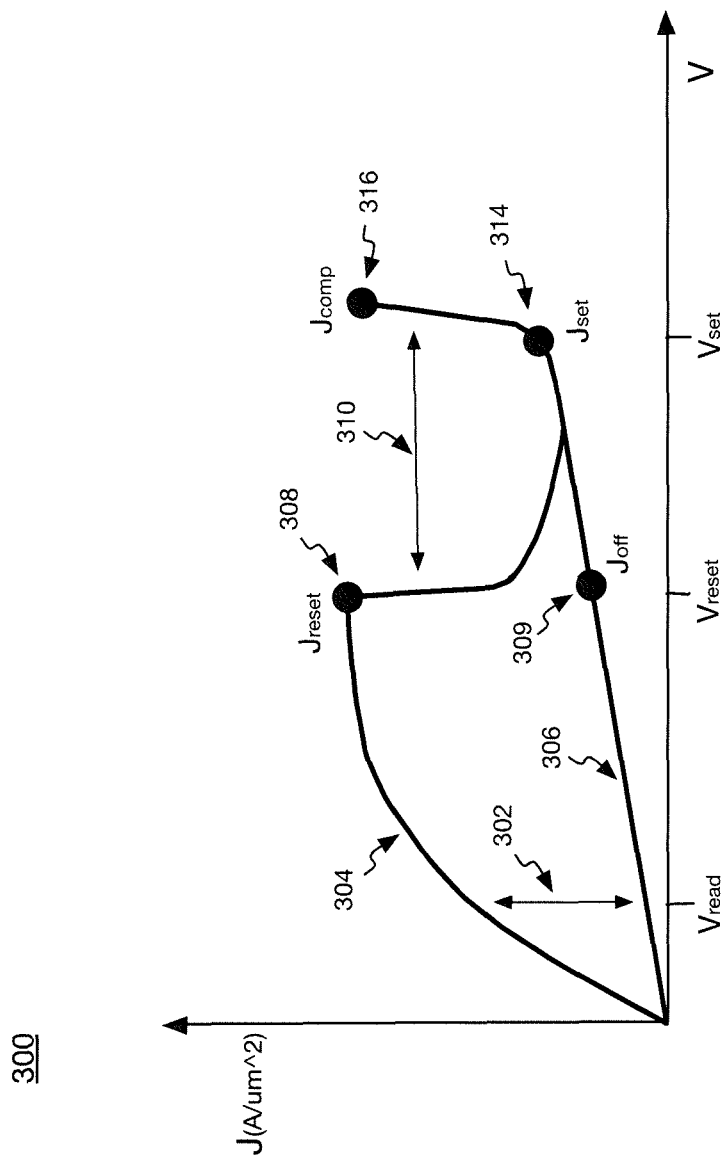
FIG. 3 shows a plot of current density versus voltage for a correlated electron switch, in according to an embodiment.

FIG. 3 shows a plot of current density versus voltage across electrically conductive terminals, such as electrically conductive terminals 101 and 103, for a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, $\{M(chxn)_2Br\}Br_2$ where M may comprise Pt, Pd, or Ni, and chxn comprises 1R,2R-cyclohexanediamine, and other such metal complexes may be used without deviating from the scope of claimed subject matter.

In one aspect, the CES device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by $NiO(C_x)$. Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as $NiO(L_x)$, where $L_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

In an embodiment, CES devices may be initially manufactured in a conductive/lower impedance state. Also, in an embodiment, CES devices may be non-volatile, in that CES devices may maintain respective impedance states until further programming is performed. For example, according to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

According to an embodiment, current in a CEM of a CES device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 3, a current density $J_{comp}$ applied during a write operation at point 316 to place the CES device in a conductive/lower impedance state may determine a compliance condition for placing the CES in an insulative/higher impedance state in a subsequent write operation. As shown, the CEM of the CES device may be subsequently placed in an insulative/higher impedance state by application of a current density $J_{reset} \geq J_{comp}$ at a voltage $V_{reset}$ at point 308, wherein $J_{comp}$ may be externally applied, in an embodiment.

A compliance current, such as an externally applied compliance current, therefore may set a number of electrons in a CEM of a CES device which are to be "captured" by holes for the Mott transition. In other words, a current applied in a write operation to place a CES device in a conductive/lower impedance state may determine a number of holes to be injected to the CEM of the CES device for subsequently transitioning the CES device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$

$$n = \left(\frac{C}{\lambda_{TF}}\right)^3$$

where:
$\lambda_{TF}$ is a Thomas Fermi screening length; and
C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a CEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the CES device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \qquad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:
$a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (5) as follows:

$$\lambda_{TF}(@V_{reset}) = a_B \left( \frac{J_{reset}}{J_{off}} \right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

As mentioned above, a CES device, also referred to as a variable impeder device, such as variable impeder device 100, may be implemented in a wide range of electronic device types. For example, a variable impeder device, such as variable impeder device 100, may be utilized in logic circuits, memory circuits, filter circuits, etc. Generally speaking, a variable impeder device, such as variable impeder device 100, may be utilized in any circuit or device, presently existing or to exist in the future, that may benefit from the variable impeder device's variable resistance and/or variable capacitance characteristics.

For example, in an embodiment, a CES device, such as variable impeder device 100, may be implemented in a memory cell, for example. In one or more embodiments, a CES memory may comprise: a variable impeder memory cell including a CES; a write circuit for placing the variable impeder memory cell in a first impedance state or a second impedance state depending on signals provided to the memory device; and a read circuit for sensing an impedance state of the memory cell and providing an electrical signal corresponding to the sensed state of the memory cell. In one aspect, an impedance of a CES in the second memory cell state may be significantly greater than the impedance in the first memory cell state.

Integrated circuits, such as example integrated circuits discussed herein, may include multiple layers of material that may be built on a substrate. Layers of material may include one or more electrically conductive layers, sometimes referred to as "metal" layers and/or "metallization" layers that may interconnect with circuit devices. As used herein, the terms "metal layer" and/or "metallization layer" refer to electrically conductive electrodes, otherwise referred to as "lines", that may be formed from an electrically conductive material. Example materials for a metallization layer may include, for example, aluminum and/or copper, to name but a couple of examples. Vias formed between metallization layers may also be formed of electrically conductive materials such as polysilicon, tungsten, copper, and/or aluminum, for example. Of course, claimed subject matter is not limited to these specific examples.

Also, as used herein, the term "substrate" may include silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal backend, and/or other semiconductor structures and/or technologies, including CES devices, for example. Various circuitry, such as driver and/or decode circuitry, for example, associated with operating a programmable fabric and/or memory array may be formed in and/or on a substrate. Furthermore, when reference is made to a "substrate" in the following description, previous process steps may have been utilized to form regions and/or junctions in the base semiconductor structure or foundation.

In an embodiment, CES devices may be implemented in any of a wide range of integrated circuit types. For example, numerous CES devices may be implemented in an integrated circuit to form a programmable fabric that may be reconfigured by changing impedance states for one or more CES devices, in an embodiment. In another embodiment, a CES programmable fabric may be utilized as non-volatile memory array, for example. Of course, claimed subject matter is not limited in scope to the specific examples provided herein. As used herein, the term "fabric" as it relates to integrated circuits refers to an underlying structure of the integrated circuit. For example, in an embodiment, an integrated circuit "fabric" may include multiple metallization layers and/or one or more vias and/or one or more CES devices to provide electrical conductivity between metallization layers. A "programmable fabric" may refer to an integrated circuit fabric that is reconfigurable. For example, as described in connection with one or more example embodiments below, a programmable fabric may include one or more CES devices having one or more different impedance characteristics that may selectively provide variable impedance electrically conductive paths between metallization layers in an integrated circuit.

Additionally, in an embodiment, CES devices may be implemented in middle-of-line (MOL) and/or back-end-of-line (BEOL) processes for an integrated circuit. For example, because a CES device may be formed directly on a source and/or drain region of a transistor formed in an integrated circuit device, and because a CES device may also be directly coupled to an electrically conductive line of a metal layer, a CES device may serve as a sort of connector between a source and/or drain region and an electrically conductive line of a metal layer, for example. Thus, as may be seen in the examples that follow, CES devices may be implemented in any of a number of layers of an integrated circuit device, and may also be implemented in any of a wide range of configurations. Additionally, CES devices may be implemented having various impedance characteristics. For example, an integrated circuit may include multiple CES devices in any of multiple layers, and the multiple CES devices may have one or more different impedance characteristics, depending at least in part on the respective correlated electron materials utilized to form the various CES devices. That is, in an example integrated circuit, a particular CES device may have a particular set of impedance characteristics due to being formed with a particular correlated electron material, and another CES device formed of a different correlated electron material may have a different set of impedance characteristics, as explained more fully below. Also, although embodiments described herein refer to different CES devices formed from different correlated electron material and/or using different fabrication techniques to bring about particular impedance characteristics, other embodiments may achieve different impedance characteristics in various CES devices by forming CES devices of different dimensions. However, claimed subject matter is not limited in scope in these respects.

FIGS. 4a-4f are illustrations depicting a cross-sectional view of a portion of an embodiment 400 of an example process for forming an integrated circuit including one or more CES devices, in accordance with an embodiment. In an embodiment, an integrated circuit, such as integrated circuit 400, may include a CES device, such as CES 455, and another CES device, such as CES 475. Also, in an embodiment, example integrated circuit 400 may include a plurality of metallization layers, including metallization layers 440, such as M1, M2, and M3. Further, in an embodiment, an integrated circuit, such as integrated circuit 400, may comprise a substrate, such as substrate 420, that may include one or more transistors and/or other semiconductor structures formed therein, for example. A connector, such as connector 430, may couple a substrate, such as substrate 420, to a metallization layer 440, such as metal layer M1. Also, although not depicted in FIGS. 4a-4f, one or more vias may electrically couple metal layers to other metal layers, in an embodiment.

Figure 4C:
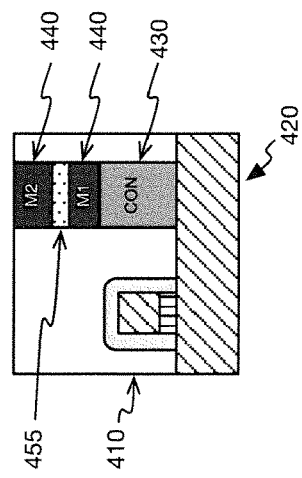
FIG. 4c is an illustration depicting a cross-sectional view of a portion of an example technique for forming an integrated circuit including one or more correlated electron switches, in accordance with an embodiment.
Figure 4B:
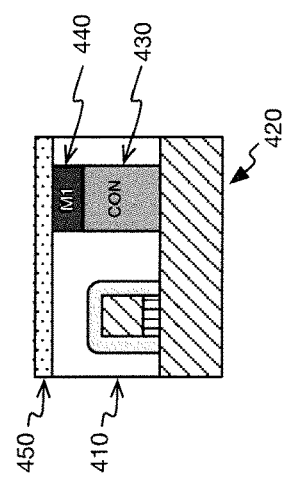
FIG. 4b is an illustration depicting a cross-sectional view of a portion of an example technique for forming an integrated circuit including one or more correlated electron switches, in accordance with an embodiment.
Figure 4A:
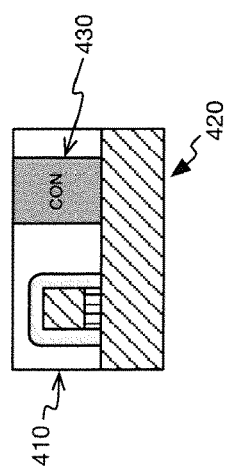
FIG. 4a is an illustration depicting a cross-sectional view of a portion of an example technique for forming an integrated circuit including one or more correlated electron switches, in accordance with an embodiment.
Figure 4F:
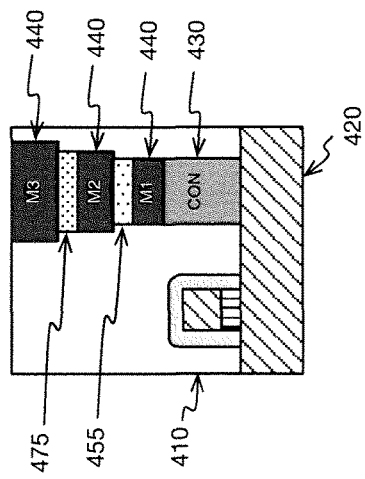
FIG. 4f is an illustration depicting a cross-sectional view of a portion of an example technique for forming an integrated circuit including one or more correlated electron switches, in accordance with an embodiment.

As depicted in FIG. 4f, for example, an integrated circuit, such as integrated circuit 400, may include multiple CES devices having different impedance characteristics. For example, a CES device, such as CES 455, may be formed of a first correlated electron material, such as CEM 450, and may exhibit a first set of impedance characteristics. Also, for example, another CES device, such as CES 475, may be formed of a second correlated electron material, such as CEM 470, and may exhibit a second set of impedance characteristics, in an embodiment. Further, in an embodiment, various CES devices in an integrated circuit, such as example integrated circuit 400, may exhibit different impedance characteristics in an insulative/higher impedance state, depending at least in part on the different correlated electron material and/or different doping and/or implantation levels, for example.

FIGS. 4a-4f depict an example process for fabricating an integrated circuit including multiple CES devices, such as CES 455 and CES 475, utilizing blanket deposition of correlated electron material. In utilizing blanket deposition techniques for depositing correlated electron material, individual layers within an integrated circuit fabric may include one or more CES devices, such as CES 450, formed of substantially the same correlated electron material. Therefore, for example fabrication techniques using blanket deposition of correlated electron material for a given layer of an integrated circuit fabric, CES devices implemented in a given layer may have substantially similar impedance characteristics, assuming similar CES device dimensions.

For example, FIG. 4a depicts substrate 420, connector 430, and an encapsulating dielectric material 410. In an embodiment, a dielectric material, such as dielectric material 410, may comprise an oxide material, although claimed subject matter is not limited in scope in this respect. As depicted in FIG. 4b, a correlated electron material, such as correlated electron material 450, may be deposited over an integrated circuit, such as integrated circuit 400. In an embodiment, a correlated electron material, such as correlated electron material 450, may be deposited via a blanket deposition technique. Example blanket deposition techniques may include spin-on deposition, chemical vapor deposition, atomic layer deposition, and/or physical vapor deposition, to name but a few examples, although claimed subject matter is not limited in scope in this respect.

In an embodiment, a correlated electron material, such as correlated electron material 450, may be selected based at least in part on impedance characteristics. As described above, CES devices may be placed in either a conductive/lower-impedance state or an insulative/higher-impedance state depending at least in part on an applied programming voltage and/or current. CES devices may maintain their current impedance state until another appropriate programming voltage and/or current are applied to cause the CES device to transition to a different impedance state, as also described above. For a particular layer of an integrated circuit fabric, CES device impedance characteristics for conductive/lower-impedance states and for insulative/higher-impedance states may be determined at least in part by selection of a particular correlated electron material for CES devices of that particular integrated circuit layer.

As depicted at FIG. 4c, a CES device, such as CES 455, may be formed. In an embodiment, photolithographic techniques may be utilized to remove and/or etch away unwanted portions of a correlated electron material, such as correlated electron material 450, to form a CES device, such as CES 455. Of course, claimed subject matter is not limited to any particular technique for forming a CES device, such as CES 455, from a blanket deposition of correlated electron material, such as correlated electron material 450. As also depicted in FIG. 4c, a second metallization layer (M2) 440 may be formed. A CES device, such as CES 455, may provide programmable electrical conductivity between metallization layers 440, such as between metallization layer M1 and metallization layer M2, in an embodiment. For example, a CES device, such as CES 455, may be placed in a conductive/lower-impedance statue or in an insulative/higher-impedance state depending, at least in part, on a programming voltage and/or current applied to a CES device, such as CES 455.

Figure 4E:
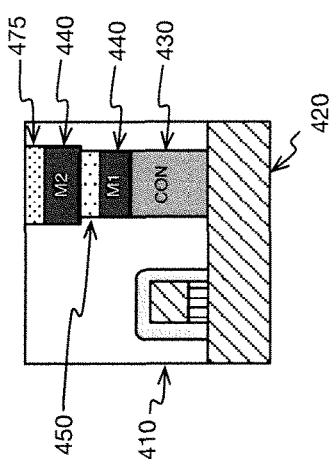
FIG. 4e is an illustration depicting a cross-sectional view of a portion of an example technique for forming an integrated circuit including one or more correlated electron switches, in accordance with an embodiment.
Figure 4D:
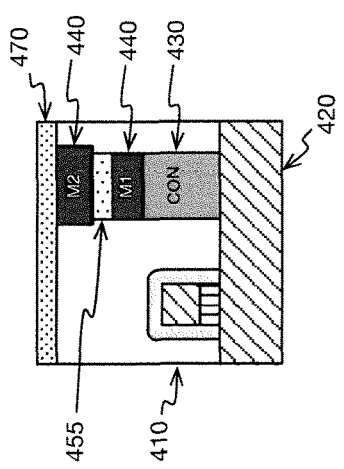
FIG. 4d is an illustration depicting a cross-sectional view of a portion of an example technique for forming an integrated circuit including one or more correlated electron switches, in accordance with an embodiment.

As depicted in FIG. 4d, a correlated electron material, such as correlated electron material 470, may be deposited over an integrated circuit, such as integrated circuit 400. In an embodiment, a correlated electron material, such as correlated electron material 470, may be deposited via a blanket deposition technique, several examples of which are mentioned above. As also mentioned previously, a correlated electron material, such as correlated electron material 470, may be selected based at least in part on impedance characteristics. As depicted at FIG. 4e, a CES device, such as CES 475, may be formed. In an embodiment, photolithographic techniques may be utilized to remove and/or etch away unwanted portions of a correlated electron material, such as correlated electron material 470, to form a CES device, such as CES 475. As mentioned, claimed subject matter is not limited to any particular technique for forming a CES device, such as CES 475, from a blanket deposition of correlated electron material, such as correlated electron material 470. As also depicted in FIG. 4f, a third metallization layer (M3) 440 may be formed. A CES device, such as CES 475, may provide programmable electrical conductivity between metallization layers 440, such as between metallization layer M2 and metallization layer M3, in an embodiment. For example, a CES device, such as CES 475, may be placed in a conductive/lower-impedance statue or in an insulative/higher-impedance state depending, at least in part, on a programming voltage and/or current applied to a CES device, such as CES 475.

In an embodiment, because correlated electron materials utilized in the formation of different layers of an integrated circuit fabric may differ in impedance characteristics, CES devices form in those different layers may exhibit different impedance characteristics. For example, correlated electron material 450 may have different impedance characteristics than correlated electron material 470, and impedance characteristics for CES 455 may differ from impedance characteristics for CES 475, for example. Of course, for a situation in which correlated electron material 450 is substantially similar to correlated electron material 470, CES devices 455 and 475 may exhibit substantially similar impedance characteristics, in an embodiment.

Figure 5C:
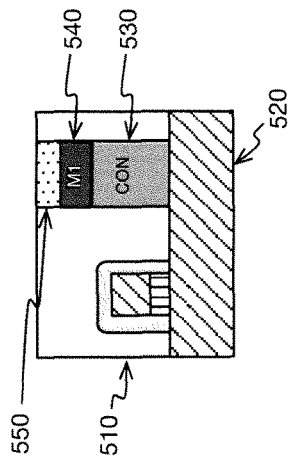
FIG. 5c is an illustration depicting a cross-sectional view of a portion of an example technique for forming an integrated circuit including one or more correlated electron switches, in accordance with an embodiment.
Figure 5B:
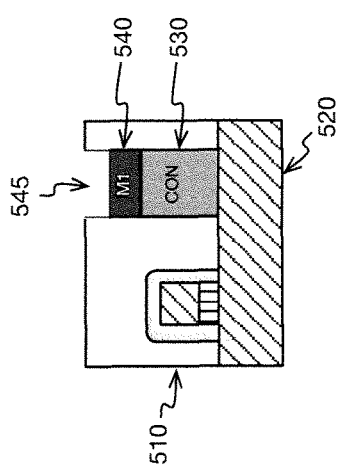
FIG. 5b is an illustration depicting a cross-sectional view of a portion of an example technique for forming an integrated circuit including one or more correlated electron switches, in accordance with an embodiment.
Figure 5A:
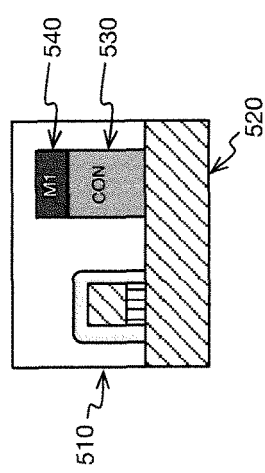
FIG. 5a is an illustration depicting a cross-sectional view of a portion of an example technique for forming an integrated circuit including one or more correlated electron switches, in accordance with an embodiment.

FIGS. 5a-4g are illustrations depicting a cross-sectional view of a portion of an embodiment 500 of an example process for forming an integrated circuit including one or more CES devices, in accordance with an embodiment. In an embodiment, an integrated circuit, such as integrated circuit 500, may include CES devices, such as CES 550, CES 560, CES 570, and CES 580. Of course, claimed subject matter is not limited to any particular amount and/or configuration of CES devices. Also, in an embodiment, example integrated circuit 500 may include a plurality of metallization layers, including metallization layers 540, such as M1, M2, M3, and M4. Again, claimed subject matter is not limited in scope to any particular amount and/or configuration of metallization layers. Further, in an embodiment, an integrated circuit, such as integrated circuit 500, may comprise a substrate, such as substrate 520, that may include one or more transistors and/or other semiconductor structures formed therein, for example. A connector, such as connector 530, may couple a substrate, such as substrate 520, to a metallization layer 540, such as metal layer M1. Also, although not depicted in FIGS. 5a-5g, one or more vias may electrically couple metal layers to other metal layers, in an embodiment.

Figure 5E:
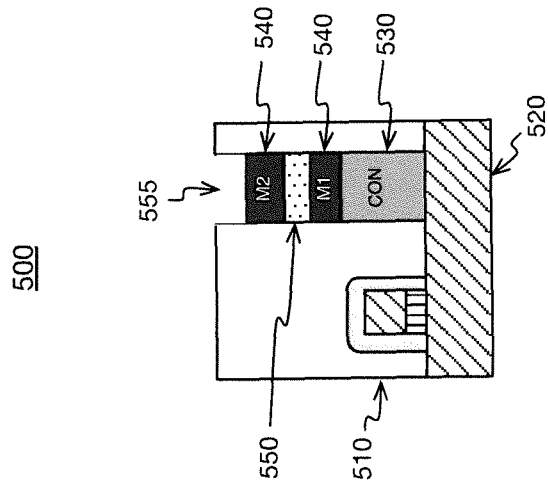
FIG. 5e is an illustration depicting a cross-sectional view of a portion of an example technique for forming an integrated circuit including one or more correlated electron switches, in accordance with an embodiment.
Figure 5D:
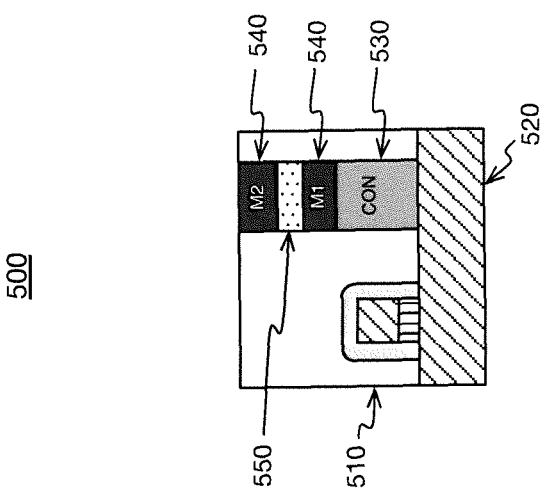
FIG. 5d is an illustration depicting a cross-sectional view of a portion of an example technique for forming an integrated circuit including one or more correlated electron switches, in accordance with an embodiment.
Figure 5G:
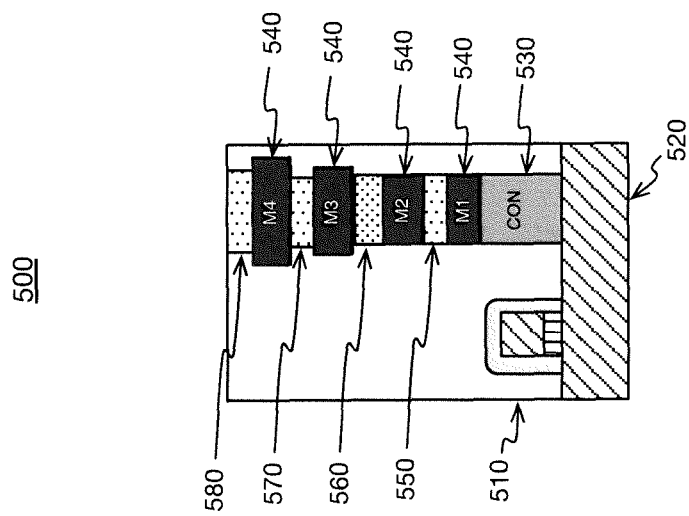
FIG. 5g is an illustration depicting a cross-sectional view of a portion of an example technique for forming an integrated circuit including one or more correlated electron switches, in accordance with an embodiment.

As depicted in FIG. 5g, for example, an integrated circuit, such as integrated circuit 500, may include multiple CES devices having different impedance characteristics. For example, a CES device, such as CES 550, may be formed of a first correlated electron material, and may exhibit a first set of impedance characteristics. Also, for example, another CES device, such as CES 560, may be formed of a second correlated electron material, and may exhibit a second set of impedance characteristics, in an embodiment. CES devices 570 and/or 580 depicted in FIG. 5g may also exhibit different impedance characteristics. In one or more embodiments, two or more CES devices may exhibit substantially similar impedance characteristics, depending on a desired integrated circuit design.

FIGS. 5a-5g depict an example process for fabricating an integrated circuit including multiple CES devices, such as CES devices 550, 560, 570, and 580, utilizing selective epitaxial deposition of correlated electron material, in an embodiment. In utilizing selective epitaxial deposition techniques for depositing correlated electron material, individual CES devices within a particular layer of an integrated circuit fabric may be formed of different correlated electron materials, or may be formed of substantially similar correlated electron materials. Further, CES devices formed in different layers of an integrated circuit fabric may also be formed of substantially the same correlated electron material, or of different correlated electron materials, or a combination thereof. Therefore, for example fabrication techniques using selective epitaxial deposition of correlated electron material, CES devices implemented within in a given layer and/or within different layers of an integrated circuit fabric may have substantially similar impedance characteristics, different impedance characteristics, or a combination of similar impedance characteristics and/or different impedance characteristics, in an embodiment.

For example, FIG. 5*a* depicts substrate 520, connector 530, and an encapsulating dielectric material 510. As depicted in FIG. 5*b*, a trench, such as trench 545, may be formed for example via photolithographic and/or other masking and/or etching techniques that may be associated with selective epitaxial deposition. As depicted at FIG. 5*c*, a correlated electron material may fill trench 545 to form a CES device, such as CES 550. In an embodiment, CES 550 may comprise a correlated electron material that may be selected based at least in part on the impedance characteristics for the correlated electron material. By selecting a particular correlated electron material from among a range of possible materials for a particular CES device, such as CES 550, particular impedance characteristics for the particular CES device, such as CES 550, may be specified and/or implemented.

Figure 5F:
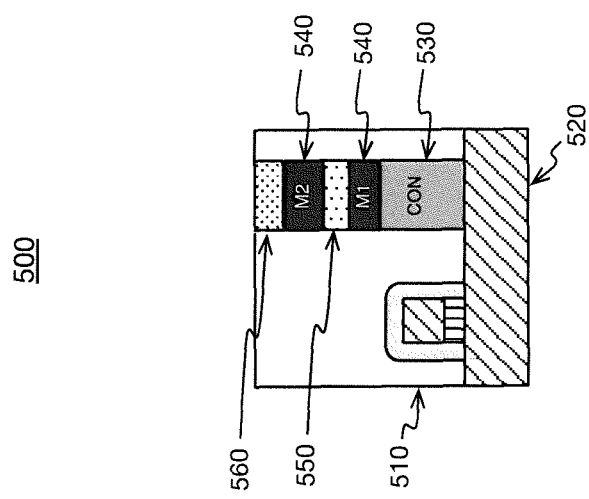
FIG. 5f is an illustration depicting a cross-sectional view of a portion of an example technique for forming an integrated circuit including one or more correlated electron switches, in accordance with an embodiment.

As depicted in FIG. 5*d*, a second metallization layer 440, such as metallization layer M2, may be formed on a CES device, such as CES 550. Also, as depicted in FIG. 5*e*, a trench, such as trench 555, may be formed for example via photolithographic and/or other masking and/or etching techniques that may be associated with selective epitaxial deposition. As depicted at FIG. 5*f*, a correlated electron material may fill trench 555 to form a CES device, such as CES 560. In an embodiment, CES 560 may comprise a correlated electron material that may be selected based at least in part on the impedance characteristics for the correlated electron material. By selecting a particular correlated electron material from among a range of possible materials for a particular CES device, such as CES 560, particular impedance characteristics for the particular CES device, such as CES 560, may be specified and/or implemented. In an embodiment, a correlated electron material for CES 560 may comprise a correlated electron material that is substantially similar to the correlated electron material for CES 550, or the correlated electron material for CES 560 may comprise a correlated electron material substantially different from the correlated electron material for CES 550. In an embodiment, use of a different correlated electron material for CES 560 than utilized for CES 550 may result in different impedance characteristics for CES 560 than may be exhibited by CES 550, for example. Similarly, use of a substantially similar correlated electron material for CES 560 than that utilized for CES 550 may result in substantially similar impedance characteristics for CES 560 than may be exhibited by CES 550, in an embodiment.

As depicted in FIG. 5*g*, additional metallization layers 440, such as M3 and/or M4, may be formed within an integrated circuit fabric, in an embodiment. Further, additional CES devices, such as CES devices 570 and/or 580 may also be formed within the fabric of example integrated circuit device 500, for example. In an embodiment, selective epitaxial deposition of specified correlated electron materials may be utilized in the formation of CES 570 and/or CES 580. Correlated electron materials for CES 570 and/or CES 580 may be selected and/or specified based, at least in part, on desired impedance characteristics for CES 570 and/or CES 580, in an embodiment.

Figure 6:
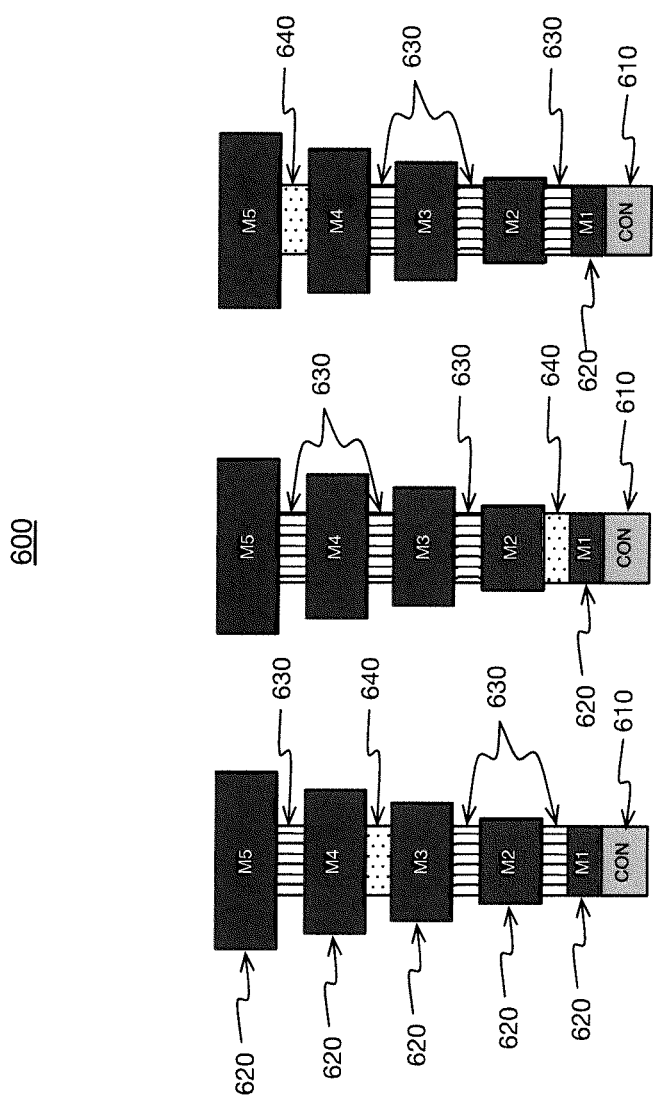
FIG. 6 is an illustration depicting a cross-sectional view of a portion of an example integrated circuit including one or more correlated electron switches, in accordance with an embodiment.
Figure 7:
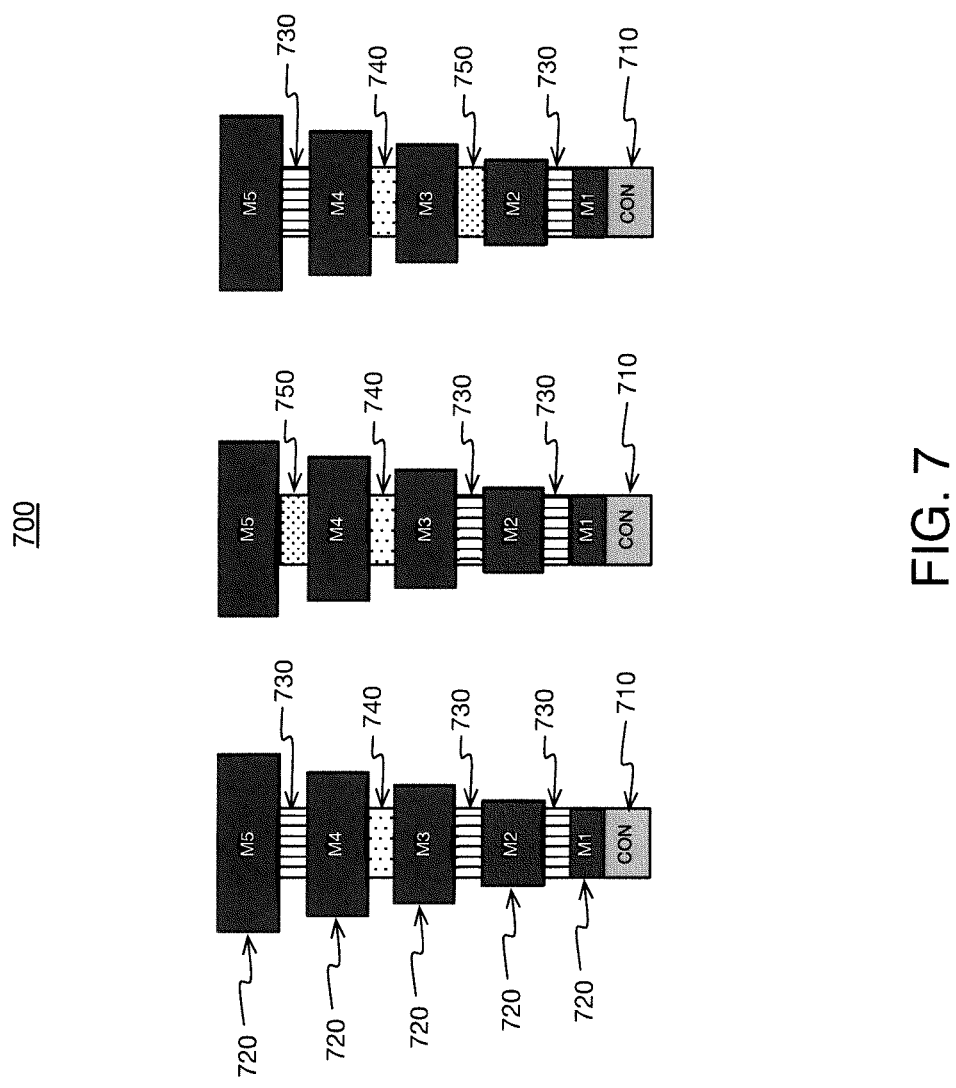
FIG. 7 is an illustration depicting a cross-sectional view of a portion of an example integrated circuit including one or more correlated electron switches, in accordance with an embodiment.
Figure 8:
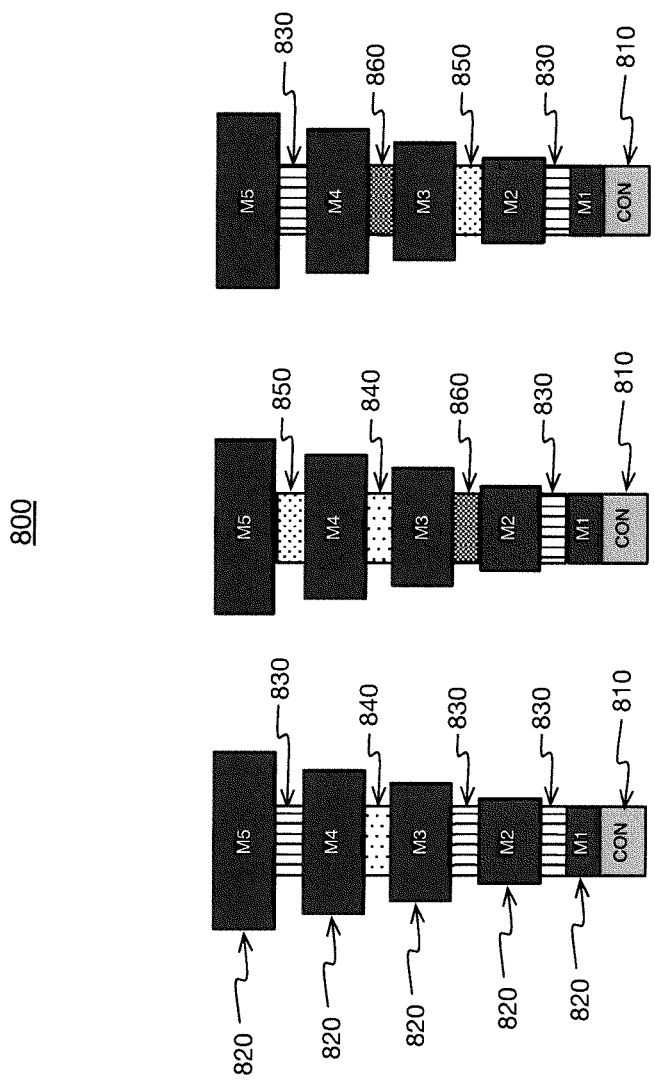
FIG. 8 is an illustration depicting a cross-sectional view of a portion of an example integrated circuit including one or more correlated electron switches, in accordance with an embodiment.

As discussed above, embodiments in accordance with claimed subject matter may fabricate CES devices utilizing blanket deposition techniques for correlated electron material and/or selective epitaxial deposition techniques, for example. Utilizing various combinations of the above-referenced techniques, a wide variety of integrated circuit fabric configurations including CES devices may be achieved. FIGS. 6-8, discussed below, demonstrate example configurations that may be implemented using blanket deposition, selective epitaxial, or a combination thereof, in accordance with claimed subject matter.

FIG. 6 is an illustration depicting a cross-sectional view of a portion of an embodiment 600 of an example integrated circuit fabric including one or more correlated electron switches, in accordance with an embodiment. For example, integrated circuit fabric 600 may include CES devices 640 positioned in various layers of the fabric. Example integrated circuit fabric 600 further comprises a plurality of vias, such as vias 630. In an embodiment, CES devices 640 and vias 630 may interconnect metallization layers 620. In an embodiment, CES devices 640 may comprise substantially similar correlated electron materials that may be deposited by blanket deposition, or epitaxial deposition, or a combination thereof.

FIG. 7 is an illustration depicting a cross-sectional view of a portion of an embodiment 700 of an example integrated circuit fabric including one or more correlated electron switches, in accordance with an embodiment. For example, integrated circuit fabric 700 may include CES devices, such as CES devices 740 and 750, positioned in various layers of the fabric. Example integrated circuit fabric 700 further comprises a plurality of vias, such as vias 730. In an embodiment, CES devices 740 and 750 and vias 730 may interconnect metallization layers 720.

In an embodiment, CES devices 740 may comprise a first correlated electron material that may be deposited by blanket deposition, or selective epitaxial deposition, or a combination thereof. CES devices 750 may comprise a second correlated electron material that may also be deposited by blanket deposition, or selective epitaxial deposition, or a combination thereof. For the example depicted in FIG. 7, CES devices at any particular level of example integrated circuit fabric 700 may comprise substantially similar correlated electron materials. For example, CES device 750, comprising a second correlated electron material, may be positioned in a layer between metallization layers M2 and M3. Another CES device 750, comprising the second correlated electron material, may also be positioned between metallization layers M4 and M5. Also, in an embodiment, CES devices 740, comprising a first correlated electron material, may be positioned between metallization layers M3 and M4. Thus, in an embodiment, for any particular layer of example integrated circuit fabric 700, a single correlated electron material may be utilized in the formation of CES devices. Any combination of blanket or selective epitaxial deposition may be used, in an embodiment.

FIG. 8 is an illustration depicting a cross-sectional view of a portion of an embodiment 800 of an example integrated circuit fabric including one or more correlated electron switches, in accordance with an embodiment. For example, integrated circuit fabric 800 may include CES devices, such as CES devices 840, 850, and 860, positioned in various layers of the fabric. Example integrated circuit fabric 800 further comprises a plurality of vias, such as vias 830. In an embodiment, CES devices 840, 850, and 860, as well as vias 830, may interconnect metallization layers 820.

In an embodiment, CES devices 840 may comprise a first correlated electron material that may be deposited by selective epitaxial deposition. CES devices 850 may comprise a second correlated electron material that may also be deposited by selective epitaxial deposition, and CES devices 860 may comprise a third correlated electron material that may further be deposited by selective epitaxial deposition. For the example depicted in FIG. 8, CES devices at any particular level of example integrated circuit fabric 800 may comprise CES devices of substantially similar correlated electron materials as other CES devices, and/or may comprise CES devices with different correlated electron materials. For example, a CES device 860 and a CES device 850 may be formed between metallization layers M2 and M3. For another example, CES devices 840 and 860 may be formed between metallization layers M3 and M4. Thus, in an embodiment, for any particular layer of example integrated circuit fabric 800, one or more correlated electron materials may be utilized in the formation of one or more CES devices having one or more different impedance characteristics. In an embodiment, selective epitaxial deposition may be used to form CES devices, in an embodiment.

Figure 9B:
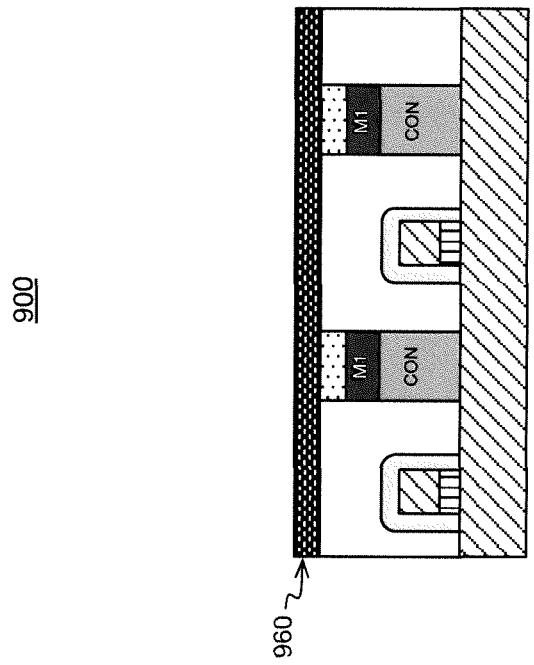
FIG. 9b is an illustration depicting a cross-sectional view of a portion of an example technique for forming an integrated circuit including one or more correlated electron switches, in accordance with an embodiment.
Figure 9A:
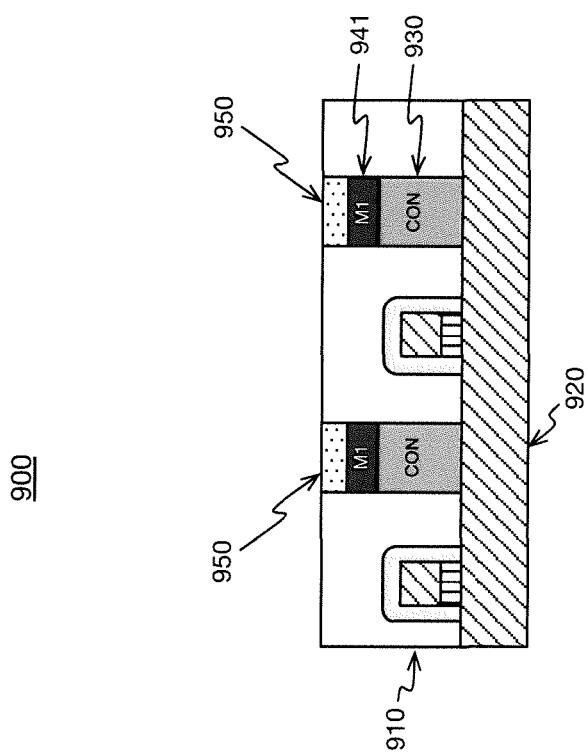
FIG. 9a is an illustration depicting a cross-sectional view of a portion of an example technique for forming an integrated circuit including one or more correlated electron switches, in accordance with an embodiment.

FIGS. 9a-9e are illustrations depicting a cross-sectional view of a portion of an embodiment 900 of an example process for forming an integrated circuit including one or more CES devices, in accordance with an embodiment. For example, FIG. 9a depicts a substrate 920, a connector 930, and an encapsulating dielectric material 910. Also depicted is a metallization layer 941, such as metallization layer M1. FIG. 9a further depicts CES devices, such as CES devices 950, that may be formed by blanket deposition and/or selective epitaxial deposition techniques.

Figure 9D:
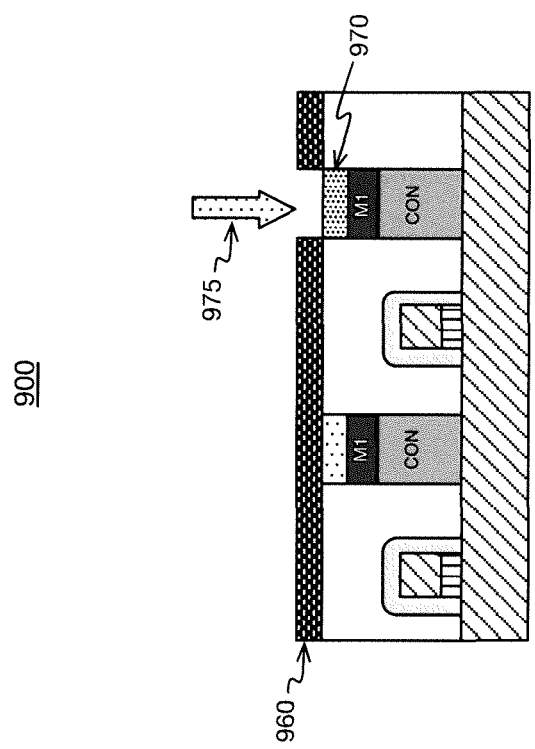
FIG. 9d is an illustration depicting a cross-sectional view of a portion of an example technique for forming an integrated circuit including one or more correlated electron switches, in accordance with an embodiment.
Figure 9C:
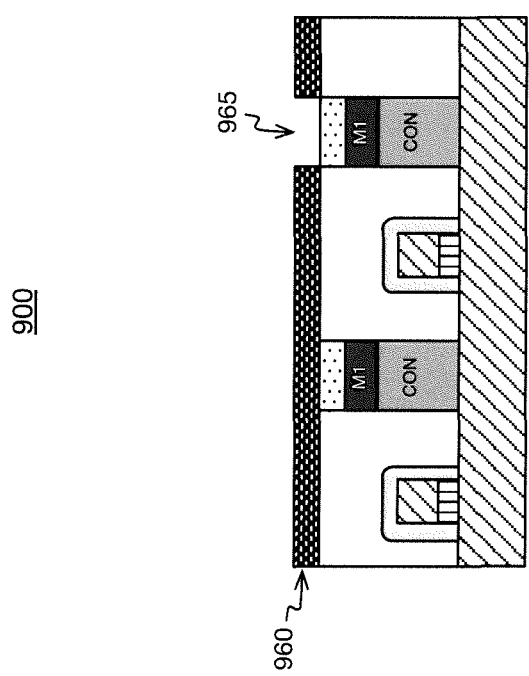
FIG. 9c is an illustration depicting a cross-sectional view of a portion of an example technique for forming an integrated circuit including one or more correlated electron switches, in accordance with an embodiment.
Figure 9E:
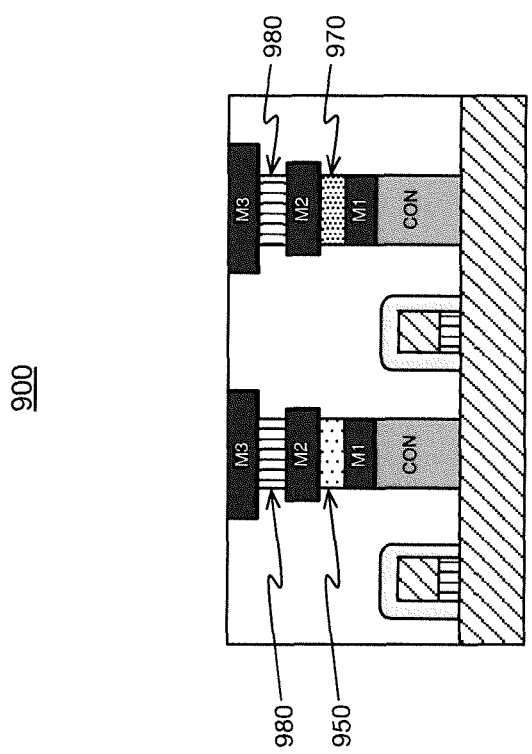
FIG. 9e is an illustration depicting a cross-sectional view of a portion of an example technique for forming an integrated circuit including one or more correlated electron switches, in accordance with an embodiment.

FIG. 9b depicts a layer of dielectric material, such as dielectric material 960, that may be formed over example integrated circuit 900. Also, as depicted in FIG. 9c, a trench 965 may be formed in dielectric material 960, thereby creating an opening by which ion implantation may be performed. For example, as depicted in FIG. 9d, ion implantation, depicted by arrow 975, may be utilized to increase the doping of the correlated electron material exposed by trench 965. In this manner, a CES device, such as CES device 970, may be created with different impedance characteristics than CES device 950, for example. By doping a correlated electron material, an increase in electrons and/or holes may create a correlated electron material having a lower impedance. In an embodiment, correlated electron material may be doped via ion implantation with carbon, oxygen, and/or nitrogen, to name but a few example dopants. In an embodiment, CES devices formed by blanket deposition and/or selective epitaxial deposition may be doped via ion implantation to adjust impedance characteristics for one or more particular CES devices. FIG. 9e depicts CES devices 950 and 970 formed between metallization layers M1 and M2, and depicts vias 980 positioned between metallization layers M2 and M3. In an embodiment, ion implantation may provide for CES devices positioned in a particular layer of an integrated circuit fabric to have differing impedance characteristics, even in the case of blanket deposition for the particular CES devices.

Figure 10:
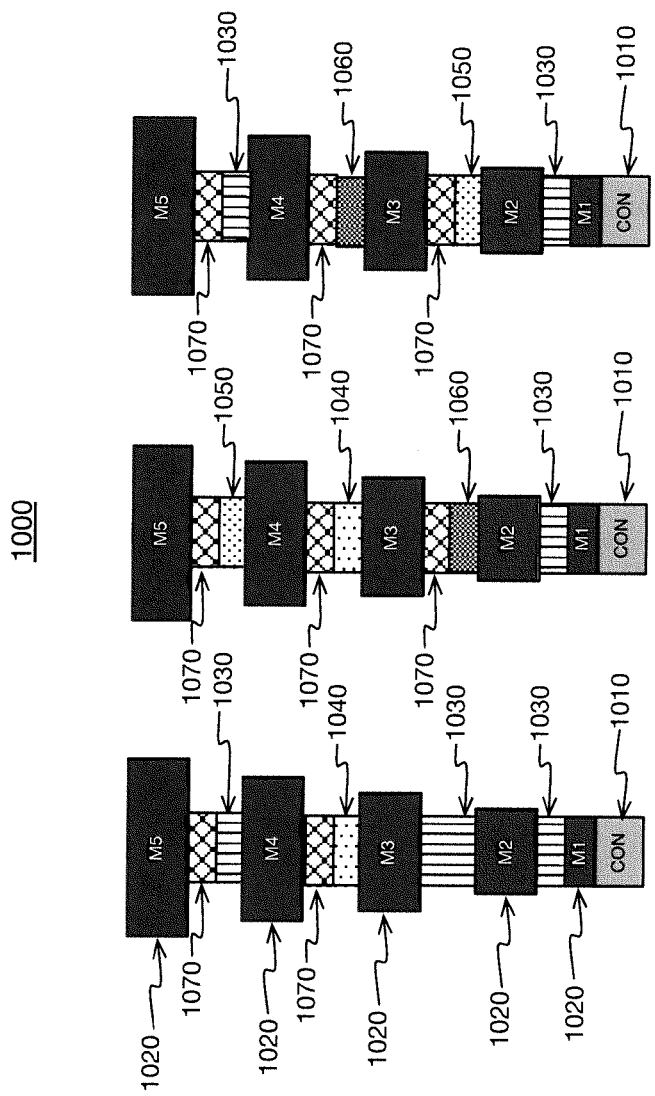
FIG. 10 depicts an example programmable fabric including a cross-point array of correlated electron switch devices, in accordance with an embodiment.

FIG. 10 is an illustration depicting a cross-sectional view of a portion of an embodiment 1000 of an example integrated circuit fabric including one or more correlated electron switches, in accordance with an embodiment. For example, integrated circuit fabric 1000 may include CES devices, such as CES devices 1040, 1050, and 1060, positioned in various layers of the fabric. Also, in an embodiment, CES devices, such CES devices 1040, 1050, and 1060, may be paired with access devices, such as diodes 1070. In an embodiment, access devices, such as diodes 1070, may help reduce leakage current due to a characteristic that sufficient voltage to cause current flow through the access device must be achieved before a voltage can be applied to respective CES devices, such as CES devices 1040, 1050, and 1060. Access devices, such as diodes 1070, paired with respective CES devices, such CES devices 1040, 1050, and/or 1060, may be referred to as offset diodes, in an embodiment. Also, in an embodiment, access devices, such as one or more of diodes 1070, may comprise schottky diodes, although claimed subject matter is not limited in scope in this respect. In an embodiment, the term "access device" refers to an element of an integrated circuit that substantially prevents current flow unless a voltage of sufficient level is applied across the access device. As mentioned above, an example access device may include a diode, such as a schottky diode. However, claimed subject matter is not limited in scope to the particular examples described herein.

Example integrated circuit fabric 1000 further comprises a plurality of vias, such as vias 1030. In an embodiment, CES devices, such as CES devices 1040, 1050, and/or 1060, coupled with access devices, such as diodes 1070, may interconnect one or more metallization layers, such as metallization layers 1020. Vias 1030 may also interconnect one or more metallization layers 1020, in an embodiment.

In an embodiment, CES devices 1040, 1050, and/or 1060 may comprise similar correlated electron material, different correlated electron material, or any combination thereof. In an embodiment, CES devices, such as CES devices 1040, 1050, and/or 1060, may comprise correlated electron material that may be deposited by selective epitaxial deposition. Thus, in an embodiment, for any particular layer of example integrated circuit fabric 1000, one or more correlated electron materials may be utilized in the formation of one or more CES devices having one or more different impedance characteristics.

As described in connection with example embodiments herein, various techniques, including blanket deposition and/or selective epitaxial deposition processes, and/or including ion implantation techniques, may allow for the fabrication of multiple CES devices having similar and/or distinctive impedance characteristics in any layer in any combination within an integrated circuit fabric. Of course, claimed subject matter is not limited in scope to the specific examples described herein.

As described above, a plurality of CES devices of an integrated circuit fabric may be formed, including a first correlated electron device having a first correlated electron material and a second correlated electron device having a second correlated electron material, wherein the first and second correlated electron materials may comprise different impedance characteristics. Also, in an embodiment, a first CES device and a second CES device of different impedance characteristics may be formed within a particular layer of and integrated circuit fabric. Further, in an embodiment, forming the first and second CES devices within a particular layer of the integrated circuit fabric may include forming the CES devices at least in part by selective epitaxial deposition. In another embodiment, the first and second CES devices within a particular layer of the integrated circuit fabric may be formed at least in part by ion implantation, such as to alter impedance characteristics for the first and/or second CES devices, for example.

In a further embodiment, first and second CES devices may be formed within different layers of an integrated circuit fabric. In an embodiment, one or more of the first and second CES devices may be formed at least in part by blanket deposition. In another embodiment, one or more of the first and second CES devices may be formed at least in part by selective epitaxial deposition.

Also, in an embodiment, two or more CES devices may be formed within a particular layer of an integrated circuit fabric at least in part by blanket deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CES devices, respectively.

As described above, one or more embodiments may comprise a fabric of an integrated circuit including a first CES device of a first correlated electron material and a second CES device of a second correlated electron material. The first and second correlated electron materials may comprise different impedance characteristics, for example. Also, in an embodiment, a first CES device and a second CES device may be positioned within a particular layer of an integrated circuit fabric. For example, one or more of the first and/or second CES devices may be formed, at least in part, by selective epitaxial deposition. In another embodiment, a first CES device and a second CES device may be positioned within different layers of an integrated circuit fabric. One or more of the first and second CES devices may be formed at least in part by blanket deposition.

In a further embodiment, an integrated circuit fabric may comprise a programmable fabric. One or more of a plurality of CES devices may be individually positioned at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CES devices, in an embodiment.

Further, in an embodiment, an integrated circuit fabric may include one or more CES devices to be positioned in one or more layers of an integrated circuit fabric, wherein the one or more correlated electron switches may comprise one or more correlated electron materials of substantially different impedance characteristics. Also, in an embodiment, one or more access devices may be positioned substantially adjacent to the one or more correlated electron switches within the integrated circuit fabric.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
    forming a plurality of correlated electron switch devices of a non-volatile and programmable fabric of an integrated circuit, including:
        forming one or more first correlated electron switch devices of a first correlated electron material, the first correlated electron material having a first particular programmable resistance characteristic and a first particular programmable capacitance characteristic, and
        forming one or more second correlated electron switch devices, including forming one or more second correlated electron switch devices of a second correlated electron material, wherein one or more properties of the second correlated electron material are varied from the first correlated electron material to yield a second particular programmable resistance characteristic in the one or more second correlated electron switch devices that varies from the first particular programmable resistance characteristic and a second particular programmable capacitance characteristic in the one or more second correlated electron switch devices that varies from the first particular programmable capacitance characteristic, the first and second particular correlated electron materials further having bulk-switching characteristics,
    wherein the programmable fabric to comprise a plurality of individually programmable variable impedance paths.

2. The method of claim 1, wherein the forming the plurality of correlated electron switch devices comprises forming the one or more first correlated electron switch devices and the one or more second correlated electron switch devices within a particular layer of the integrated circuit.

3. The method of claim 2, wherein the forming the one or more first correlated electron switch devices and the one or more second correlated electron switch devices within the particular layer of the integrated circuit comprises selective epitaxial deposition to deposit the first particular correlated electron material and the second particular correlated electron material.

4. The method of claim 2, wherein the forming the one or more first correlated electron switch devices and the one or more second correlated electron switch devices within the particular layer of the integrated circuit fabric comprises adjusting impedance characteristics for one or more of the one or more first correlated electron switch devices and the one or more second correlated electron switch devices via ion implantation.

5. The method of claim 1, wherein the forming the plurality of correlated electron switch devices comprises forming the one or more first correlated electron switch devices and the one or more second correlated electron switch devices within different layers of the integrated circuit.

6. The method of claim 5, wherein the forming the one or more first correlated electron switch devices and the one or more second correlated electron switch devices within the different layers of the integrated circuit includes blanket deposition to deposit one or more of the first particular correlated electron material and the second particular correlated electron material.

7. The method of claim 5, wherein the forming the one or more first correlated electron switch devices and the one or more second correlated electron switch devices within the different layers of the integrated circuit fabric includes selective epitaxial deposition to deposit one or more of the first particular correlated electron material and the second particular correlated electron material.

8. The method of claim 1, wherein the forming the plurality of correlated electron switch devices comprises blanket deposition of correlated electron material for two or more additional correlated electron switch devices within a particular layer of the programmable fabric.

9. The method of claim 1, wherein the forming the plurality of correlated electron switch devices comprises forming the one or more first correlated electron switch devices via selective epitaxial deposition and forming the one or more second correlated electron switch devices via blanket deposition.

10. The method of claim 1, further comprising positioning one or more access devices substantially adjacent to one or more correlated electron switch devices of the plurality of correlated electron switch devices.

11. An apparatus, comprising: a non-volatile programmable fabric of an integrated circuit to include:
one or more first correlated electron switch devices of a first correlated electron material, wherein the first correlated electron material to have a first particular programmable resistance characteristic and a first particular programmable capacitance characteristic; and
one or more second correlated electron switch devices of a second correlated electron material, wherein one or more properties of the second electron material to be varied from the first correlated electron material to yield a second particular programmable resistance characteristic in the one or more second correlated electron switch devices that varies from the first particular programmable resistance characteristic and a second particular programmable capacitance characteristic, in the one or more second correlated electron switch devices that varies from the first particular programmable capacitance characteristic, the first and second particular correlated electron materials further to have bulk-switching characteristics,
wherein the programmable fabric to comprise a plurality of individually programmable variable impedance paths.

12. The apparatus of claim 11, wherein the one or more first correlated electron switch devices and the one or more second correlated electron switch devices to be positioned within a particular layer of the programmable fabric.

13. The apparatus of claim 12, wherein one or more of the first particular correlated electron material and the second particular correlated electron material to be deposited by selective epitaxial deposition.

14. The apparatus of claim 11, wherein the one or more first correlated electron switch devices and the one or more second correlated electron switch devices to be positioned within different layers of the programmable fabric.

15. The apparatus of claim 14, wherein one or more of the first particular correlated electron material and the second particular correlated electron material to be deposited by blanket deposition.

16. The apparatus of claim 11, wherein the plurality of individually programmable variable impedance paths to comprise a plurality of individually programmable variable impedance paths between two or more layers of the programmable fabric.

17. The apparatus of claim 16, wherein one or more of the plurality of correlated electron switch devices to be individually positioned at one or more intersections of electrically conductive lines of a first metallization layer and electrically conductive lines of a second metallization layer of the integrated circuit.

18. The apparatus of claim 17, further comprising one or more access devices to be positioned at one or more of the intersections of the electrically conductive lines of the first metallization layer and the electrically conductive lines of the second metallization layer.

19. An apparatus, comprising:
a non-volatile programmable fabric to include a plurality of correlated electron switch devices to be positioned in one or more layers of the programmable fabric,
wherein one or more first correlated electron switch devices to comprise a first correlated electron material, wherein the first correlated electron material to include a first particular programmable resistance characteristic and a first particular programmable capacitance characteristic, and
wherein one or more second correlated electron switch devices to comprise a second correlated electron material, wherein the second correlated electron material to have one or more properties that are varied from the first correlated electron material to yield a programmable resistance characteristic in the one or more second correlated electron switch devices that varies from a programmable resistance characteristic of the first correlated electron material and a programmable capacitance characteristic in the one or more second correlated electron switch devices that varies from a programmable capacitance characteristic of the first correlated electron material, the first and second particular correlated electron materials further to have bulk-switching characteristics,
wherein the programmable fabric to comprise a plurality of individually programmable variable impedance paths.

20. The apparatus of claim 19, further comprising one or more access devices to be positioned substantially adjacent to one or more of the plurality of correlated electron switch devices within the programmable fabric.

* * * * *